(12) United States Patent
Ottens et al.

(10) Patent No.: US 7,196,768 B2
(45) Date of Patent: Mar. 27, 2007

(54) LITHOGRAPHIC APPARATUS AND DEVICE MANUFACTURING METHOD

(75) Inventors: Joost Jeroen Ottens, Veldhoven (NL); Jeroen Johannes Sophia Maria Mertens, Duizel (NL); Frederik Eduard De Jong, Eindhoven (NL); Koen Goorman, Eindhoven (NL); Boris Menchtchikov, Eindhoven (NL); Edwin Van Gompel, Valkenswaard (NL)

(73) Assignee: ASML Netherlands B.V., Veldhoven (NL)

( * ) Notice: Subject to any disclaimer, the term of this patent is extended or adjusted under 35 U.S.C. 154(b) by 163 days.

(21) Appl. No.: 10/972,754

(22) Filed: Oct. 26, 2004

(65) Prior Publication Data

US 2006/0087637 A1    Apr. 27, 2006

(51) Int. Cl.
*G03B 27/52* (2006.01)
*G03B 27/42* (2006.01)
*G03B 27/58* (2006.01)

(52) U.S. Cl. .............................. 355/30; 355/53; 355/72
(58) Field of Classification Search ................. 355/30, 355/53, 72
See application file for complete search history.

(56) References Cited

U.S. PATENT DOCUMENTS 5,220,171 A * 6/1993 Hara et al. ............... 250/443.1
5,231,291 A * 7/1993 Amemiya et al. ........ 250/443.1
5,577,552 A * 11/1996 Ebinuma et al. ............ 165/296
6,483,569 B2 * 11/2002 Ota ............................. 355/30
7,017,658 B2 * 3/2006 Hisai et al. ................. 165/201
2004/0207824 A1   10/2004 Lof et al. ..................... 355/30

FOREIGN PATENT DOCUMENTS

| EP | 0 320 297 A2 | 6/1989 |
|----|--------------|--------|
| EP | 0 320 297 A3 | 6/1989 |
| EP | 1 282 157 A2 | 2/2003 |
| EP | 1 282 157 A3 | 3/2004 |
| JP | 4-271108     | 9/1992 |
| JP | 7-81755      | 3/1995 |
| JP | 9-270457     | 10/1997 |

OTHER PUBLICATIONS

Translation of JP 09-270457 cited by Applicant.*
European Search Report issued for European Patent Application No. 05077374.6-2222 dated Feb. 16, 2006.

* cited by examiner

*Primary Examiner*—Alan Mathews
(74) *Attorney, Agent, or Firm*—Pillsbury Winthrop Shaw Pittman LLP

(57) ABSTRACT

A lithographic apparatus includes a substrate support that is constructed to support a substrate, and a projection system that is configured to project a patterned radiation beam onto a target portion of the substrate. The substrate support is arranged to move the substrate along a predetermined trajectory of subsequently targeted target portions of the substrate. The substrate support includes a duct configuration for providing thermal stabilization to the substrate. The duct configuration is arranged to duct thermally stabilizing media in the support, and to substantially duct the media away from a part of the substrate support that supports the target portion via parts of the substrate support that support previously targeted portions of the substrate, so as to keep subsequently targeted target portions thermally stable.

12 Claims, 5 Drawing Sheets

LITHOGRAPHIC APPARATUS AND DEVICE MANUFACTURING METHOD

FIELD

The present invention relates to a lithographic apparatus that includes a substrate table that is arranged to move a substrate along a predetermined trajectory of subsequently targeted target portions, and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

In recent developments, an increased problem of providing thermally stable substrates occurs due to ever more demanding requirements for image resolution, such as in the new field of immersion lithography. Here, an increased problem of thermal stabilization occurs, because immersion liquids may cause thermal cooling by transitioning to a vapor phase. Hence, it is found that local thermal gradients may occur in the substrate, and such gradients should be stabilized. Also, it has been found that during a photolithographic treatment of a substrate, the substrate, due to subsequent illuminations of target portions, tends to warm up unevenly, with a temperature front that progresses over the surface area of the substrate. This temperature front may also cause thermal gradients, which may amount to local deformations of the substrate. Evidently, for nanometer projection accuracy, this may cause problems in focus and overlay errors. That is, due to thermal deformations, the surface of the substrate may bend away from an ideal projection plane, which may result in focus loss or at least an effective sideways movement of the image plane such that overlay problems may occur.

SUMMARY

It is an aspect of the present invention to provide a photolithographic apparatus in which the aforementioned thermal problems may be treated, and in which an improved thermal stabilization of the substrate may be provided.

According to an aspect of the invention, there is provided a lithographic apparatus. The apparatus includes an illumination system configured to condition a radiation beam, and a patterning device support constructed to support a patterning device. The patterning device is capable of imparting the radiation beam with a pattern in its cross-section to form a patterned radiation beam. The apparatus also includes a substrate support constructed to support a substrate, and a projection system configured to project the patterned radiation beam onto a target portion of the substrate. The substrate support is arranged to move the substrate along a predetermined trajectory of subsequently targeted target portions of the substrate. The substrate support includes a duct configuration for providing thermal stabilization to the substrate. The duct configuration is arranged to duct thermally stabilizing media in the support, and to substantially duct the media away from a part of the substrate support that supports the target portion via parts of the substrate support that support previously targeted portions of the substrate, so as to keep subsequently targeted target portions thermally stable.

According to an aspect pf the invention, there is provided a substrate support for supporting a substrate in a lithographic apparatus. The substrate support includes a duct configuration arranged to duct thermally stabilizing media in the support, and to substantially duct the media away from a part of the substrate support that supports a target portion of the substrate that receives a patterned radiation beam via parts of the substrate support that support previously targeted portions of the substrate, so as to keep subsequently targeted target portions thermally stable.

Thus, the subsequent target portions are not thermally affected by heated media that comes from the targeted portion so that a better thermal stabilization may be achieved. The thermally stabilizing media may also be referred to as coolant, although it will be clear that a wider meaning of providing thermal stability is used.

According to an aspect of the invention, there is provided a method of manufacturing a device using a lithographic apparatus. The method includes projecting a patterned radiation beam onto a target portion of a substrate that is supported by a substrate support that is in thermal contact with the substrate, and moving the substrate along a predetermined trajectory from a starting target portion to a finish target portion. The trajectory defines an averaged progression direction of movement of the substrate support. The method also includes ducting thermally stabilizing media in the substrate support in an averaged direction of flow opposite to the averaged progression direction of movement of the substrate support.

In an embodiment, a method of manufacturing a device using a lithographic apparatus is provided. The method includes projecting a patterned radiation beam onto a target portion of a substrate that is supported by a substrate support that is in thermal contact with the substrate, moving the substrate along a predetermined trajectory from a starting target portion to a finish target portion, and ducting thermally stabilizing media in the support away from the target portion via previously targeted portions of the substrate so as to keep subsequently targeted portions thermally stable.

According to an aspect of the invention, there is provided an immersion lithographic apparatus. The immersion lithographic apparatus includes an illumination system configured to condition a radiation beam, and a patterning device support constructed to support a patterning device. The patterning device is capable of imparting the radiation beam with a pattern in its cross-section to form a patterned radiation beam. The apparatus also includes a substrate support constructed to support a substrate, and a projection system configured to project the patterned radiation beam onto a target portion of the substrate. The projection system is arranged to provide an optical liquid between the substrate and the projection system for providing immersion lithography. The substrate support is arranged to move the substrate along a predetermined trajectory of subsequently targeted target portions. The substrate support comprises a duct configuration for providing thermal stabilization to the substrate. The duct configuration is arranged to duct thermally stabilizing media in the support, and to substantially duct the media away from a part of the substrate support that supports the target portion via parts of the substrate support that support previously targeted portions of the substrate, so as to keep subsequently targeted target portions thermally stable.

According to an aspect of the invention, there is provided a method of manufacturing a substrate support for supporting a substrate. The method includes creating a duct layout configuration in a top layer and/or a bottom layer of the substrate support for ducting corrosive media therethrough. The top layer is configured to contact the substrate. The method also includes depositing a material on one of the top and bottom layers for anodic bonding the top and bottom layers so as to create a bonding layer, and bonding the top layer to the bottom layer through anodic bonding so as to migrate the material of the bonding layer in the one of the top and bottom layers, to prevent a corrosion sensitive bonding surface.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
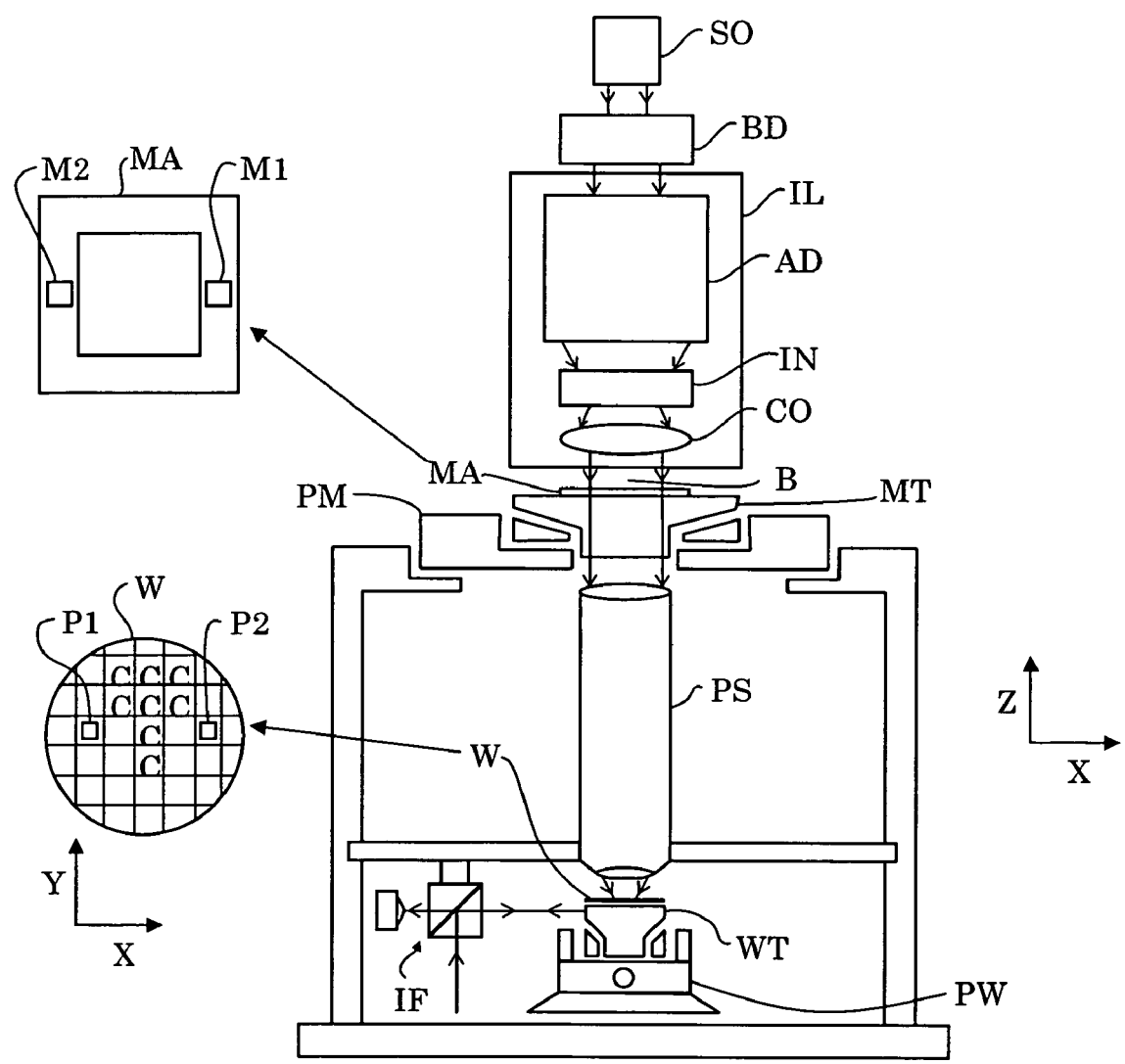
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation), a support structure (e.g. a mask table) MT constructed to support a patterning device (e.g. a mask) MA and connected to a first positioner PM configured to accurately position the patterning device MA in accordance with certain parameters, a substrate table (e.g. a wafer table) WT constructed to hold a substrate (e.g. a resist-coated wafer) W and connected to a second positioner PW configured to accurately position the substrate in accordance with certain parameters, and a projection system (e.g. a refractive projection lens system) PS configured to project a pattern imparted to the radiation beam B by the patterning device MA onto a target portion C (e.g. including one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure MT supports, i.e. bears the weight of, the patterning device MA. It holds the patterning device MA in a manner that depends on the orientation of the patterning device MA, the design of the lithographic apparatus, and other conditions, such as whether or not the patterning device MA is held in a vacuum environment. The support structure MT may use mechanical, vacuum, electrostatic or other clamping techniques to hold the patterning device. The support structure MT may be a frame or a table, for example, which may be fixed or movable as required. The support structure MT may ensure that the patterning device MA is at a desired position, for example with respect to the projection system. Any use of the terms "reticle" or "mask" herein may be considered synonymous with the more general term "patterning device."

The term "patterning device" as used herein should be broadly interpreted as referring to any device that may be used to impart a radiation beam with a pattern in its cross-section so as to create a pattern in a target portion of the substrate. It should be noted that the pattern imparted to the radiation beam may not exactly correspond to the desired pattern in the target portion of the substrate, for example, if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" as used herein should be broadly interpreted as encompassing any type of projection system, including refractive, reflective, catadioptric, magnetic, electromagnetic and electrostatic optical systems, or any combination thereof, as appropriate, for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type in which at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example, when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases, the source may be an integral part of the lithographic apparatus, for example, when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
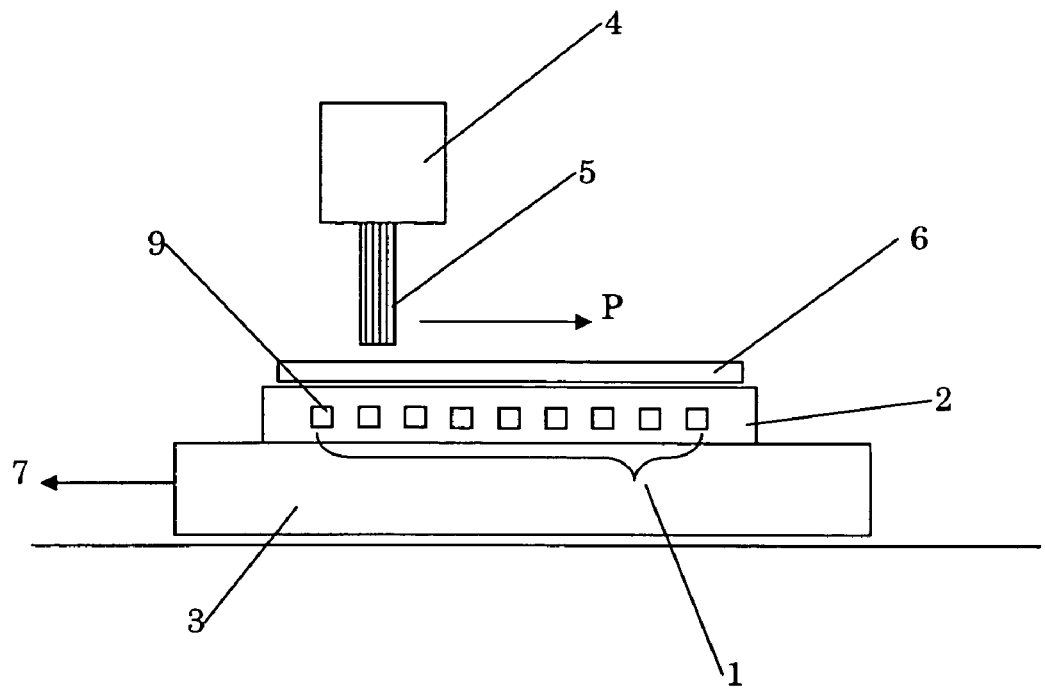
FIG. 2 depicts an embodiment of a substrate support of the apparatus of FIG. 1.
Figure 3:
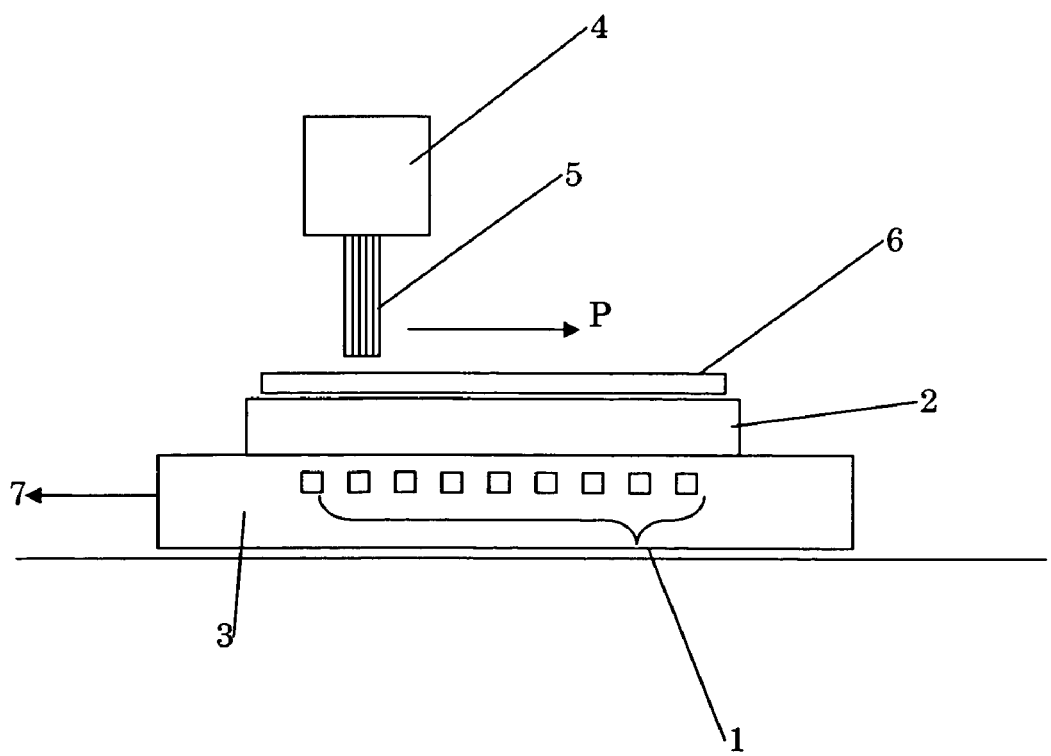
FIG. 3 depicts another embodiment of a substrate support of the apparatus of FIG. 1.

FIG. 2 and FIG. 3 give alternative embodiments for providing a coolant structure 1 in a substrate support 2. As is apparent from the figures, the substrate support 2 is moved by a chuck 3 below a projection system 4 described with reference to PS in FIG. 1 that provides a patterned beam of radiation 5 to illuminated target positions on the substrate 6 and not further discussed here. Illustrated is a general direction of movement 7 of the chuck 3 relative to the projection system 4 (which is kept fixed), in which rows of dies 8 (see FIG. 4 and FIG. 5) are scanned in rows perpendicular to the plane of view, defining a progressive direction P of targets to be illuminated. In this setup, the support structure 2 is normally identified as a "wafer table", which is typically a rigid structure, usually made of glass type or ceramic materials that provides a flat plane of support to the substrate 6 and is in direct contact therewith. The wafer table 2 may include a plurality of protrusions, which limit the contact area so that contamination provides minimal distortions of the ideal flat plane of support. In FIG. 2, the wafer table 2 is provided with a duct structure 1, as will be further illustrated with reference to FIG. 4 and FIG. 5. Alternatively, or possibly in addition, as depicted in FIG. 3, the duct structure 1 may be provided in a lower part of the substrate support 2, which is indirectly thermally coupled to the substrate 6 via the wafer table 2, as depicted in FIG. 2. Such a lower part is commonly referred to as a chuck 3 or second positioner PW, in particular, the fine stroke module thereof, as explained above with reference to FIG. 1. This alternative position may be less effective in thermal stabilization since it requires thermal conduction through the wafer table 2. However, the structure 1 may be easier to implement, because the wafer table 2 typically has a rigid structure, and coolant ducts 9 may be less easy to implement.

Figure 4:
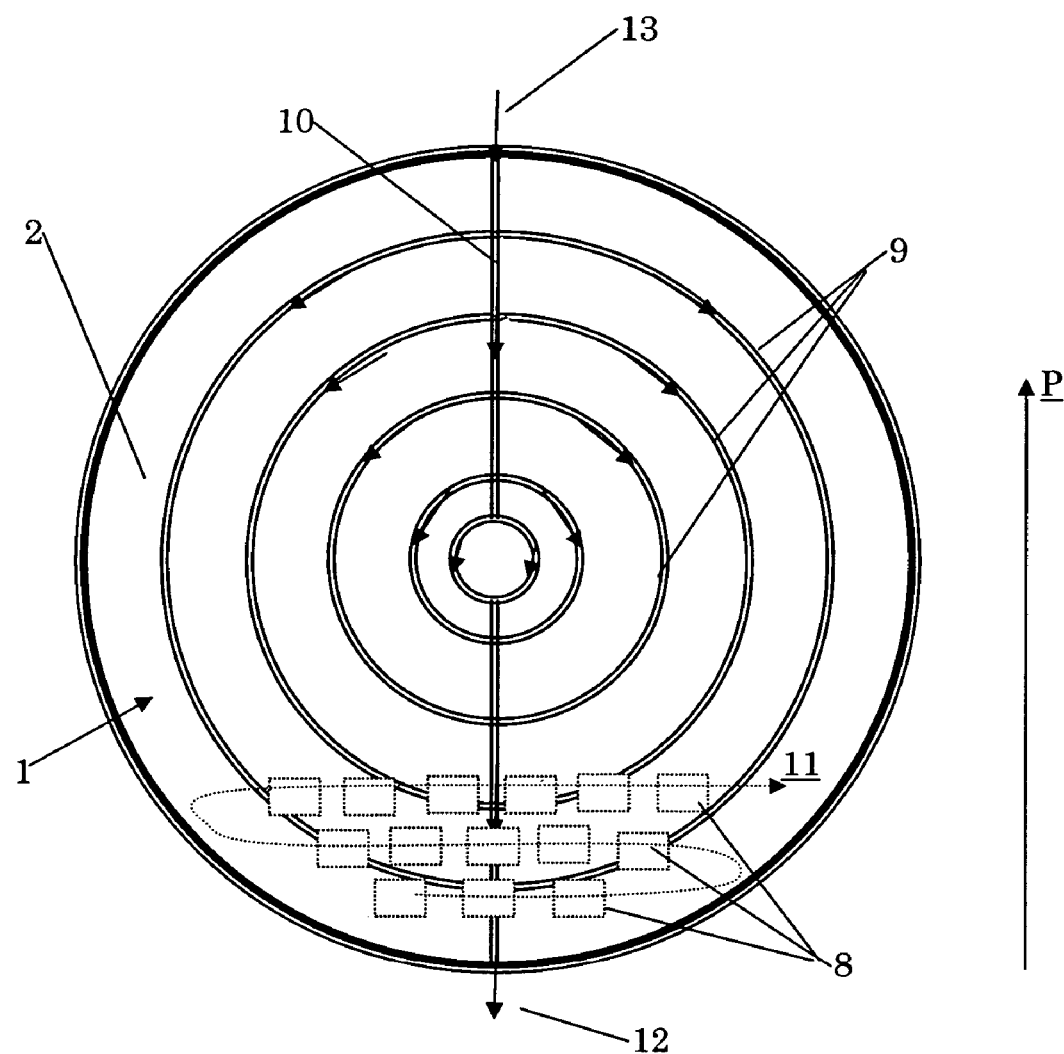
FIG. 4 provides a more detailed view of an embodiment of the substrate support of FIG. 2.

FIG. 4 illustrates an embodiment of a duct configuration 1 for a wafer table 2 according to the invention. In particular, the illustrated duct configuration 1 is concentrically arranged in a round wafer table 2. A plurality of ducts 9 are connected via at least one central duct 10. The ducts 9, 10 are arranged to move or duct thermally stabilizing media through the wafer table 2, in particular, water, for providing thermal stabilization to the substrate 6 that is kept in thermal contact on top of the wafer table 2 (not depicted). By balancing the flow resistance of the duct circuits, optimal flow conditions may be provided. In the lower half of the picture, a trajectory 11 of subsequently illuminated target portions 8 is schematically indicated. This illumination usually is carried out row for row, and the arrow P defines an averaged progression direction of subsequently illuminated portions 8 of the wafer ("dies"). It can be seen that the duct configuration 1 in the wafer table defines an averaged direction of flow of the thermally stabilizing media direction in a direction opposite to the averaged progression direction P. In this way, the target portions 8 that are still to be illuminated in a higher subsequent order may be thermally affected in a minimal way by heated media that comes from the targeted portions and is drained towards the outlet 12. Fresh coolant from the inlet 13 should be unaffected by portions of the wafer that are already illuminated and hence, a better thermal stabilization may be achieved for the portions that are yet to be illuminated. In this way, thermal deformation may be further prevented.

Figure 5:
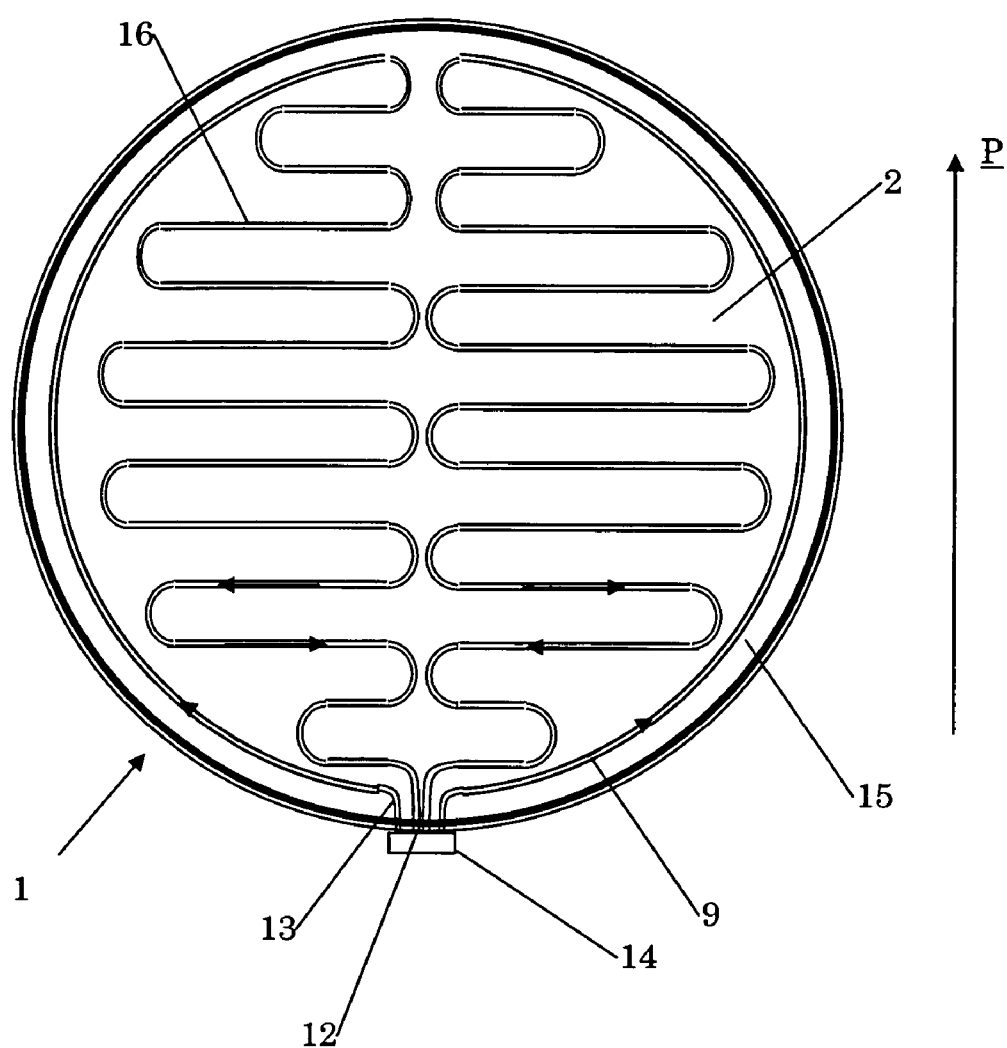
FIG. 5 provides a more detailed view of another embodiment of the substrate support according to the invention.

FIG. 5 shows a second embodiment of a wafer table 2 according to the invention. As can be seen in FIG. 5, the duct configuration 1 has a central connection part 14 at which both outlet 12 and inlet 13 portions are arranged. From the inlet portion 13, a duct 9 is arranged to duct the thermally stabilizing media directly via a peripheral edge 15 of the wafer table 2 to the other side of the wafer table 2. Because the periphery of the wafer may be most sensitive to thermal disturbances, this configuration may also help in thermally stabilizing the periphery of the substrate 6. As the flow passes the side opposite to the connection part 14, the duct is further arranged according to a meandering circuit 16. In this way, the coolant flows from one side to an opposite side of the substrate support 1 via a mirrored row by row configuration, which may be coinciding with the row configuration of dies 8 (see FIG. 4) to be illuminated.

Figure 6:
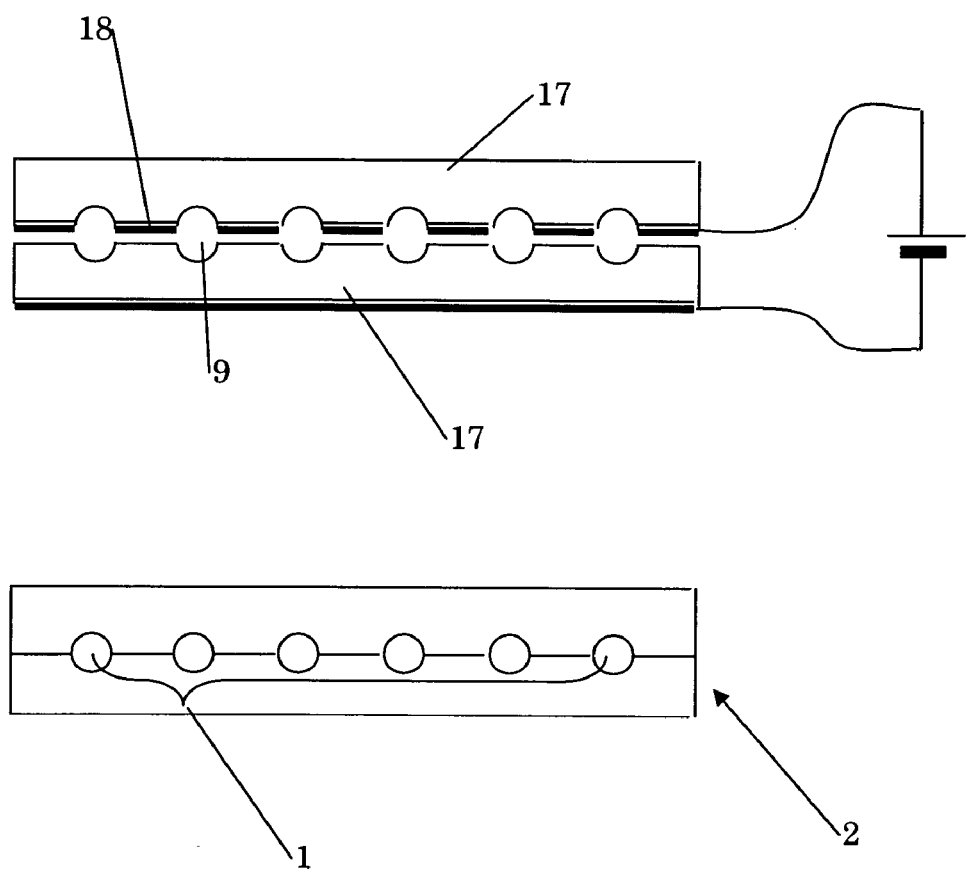
FIG. 6 schematically illustrates a manufacturing method for providing a substrate support according to the invention.

It has been found, referring to the embodiment depicted in FIG. 6, that the duct structure 1 may be integrated in a wafer table 2 by providing a layered structure that is bonded together. In one or both of the bonded layers 17 the ducting layout may be provided to form a duct 9 in bonded configuration. The bonding is preferably formed by anodic bonding. Furthermore, anticorrosive materials may be used. In particular, the anodic bonding layer 18 may be anticorrosive or entirely migrated into the bonded layer 17, as is further illustrated with reference to FIG. 6.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in, for example, a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example, imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5–20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus comprising:
   an illumination system configured to condition a radiation beam;
   a patterning device support constructed to support a patterning device, the patterning device being capable of imparting the radiation beam with a pattern in its cross-section to form a patterned radiation beam;
   a substrate support constructed to support a substrate; and
   a projection system configured to project the patterned radiation beam onto a target portion of the substrate,
   said substrate support being arranged to move the substrate along a predetermined trajectory of subsequently targeted target portions of the substrate, said trajectory defining an averaged progression direction of said subsequently targeted portions of said substrate,
   wherein said substrate support comprises a duct configuration for providing thermal stabilization to said substrate, said duct configuration being arranged to duct thermally stabilizing media in said substrate support, and to substantially duct the media away from a part of said substrate support that supports said target portion in an averaged direction opposite to said averaged progression direction via parts of said substrate support that support previously targeted portions of the substrate, so as to keep subsequently targeted target portions thermally stable during movement of the substrate along the entire trajectory.

2. A lithographic apparatus according to claim 1, wherein said duct configuration comprises an inlet portion and an outlet portion for inlet and outlet of said thermally stabilizing media, respectively, wherein said inlet and outlet portions are arranged adjacent to each other on one side of the substrate support, and wherein from said inlet portion, a duct is arranged to duct the thermally stabilizing media via a peripheral edge of said substrate support to an opposite side of the substrate support.

3. A lithographic apparatus according to claim 1, wherein said thermally stabilizing media flows from one side to an opposite side of the substrate support via a meandering circuit.

4. A lithographic apparatus according to claim 1, wherein said duct configuration comprises a plurality of ducts that are arranged concentrically, said ducts being connected via at least one radially oriented duct.

5. A lithographic apparatus according to claim 4, wherein said thermally stabilizing media flows from one side to an opposite side of the substrate support.

6. A lithographic apparatus according to claim 1, wherein said duct configuration comprises a layout that is following the trajectory of subsequent scanning.

7. A substrate support for supporting a substrate in a lithographic apparatus, said substrate support comprising a duct configuration arranged to duct thermally stabilizing media in said substrate support, and to substantially duct the media away from a part of said substrate support that supports a target portion of the substrate that receives a patterned radiation beam via parts of said substrate support that support previously targeted portions of the substrate in an averaged direction of flow opposite an averaged direction of movement of the substrate along a predetermined trajectory as the substrate receives the patterned radiation beam, so as to keep subsequently targeted target portions thermally stable during movement of the substrate along the entire trajectory.

8. A substrate support according to claim 7, wherein said substrate support comprises an inlet portion and outlet portion for inlet and outlet of said thermally stabilizing media, wherein said inlet and outlet portions are arranged adjacent to each other on one side of the substrate support, and wherein from said inlet portion a duct is arranged to duct the thermally stabilizing media directly via a peripheral edge of said substrate support to an opposite side of the substrate support.

9. A substrate support according to claim 7, wherein said thermally stabilizing media flows from one side to an opposite side of the substrate support via a meandering circuit.

10. A method of manufacturing a device using a lithographic apparatus, the method comprising:
projecting a patterned radiation beam onto a target portion of a substrate that is supported by a substrate support that is in thermal contact with the substrate;
moving the substrate along a predetermined trajectory from a starting target portion to a finish target portion, said trajectory defining an averaged progression direction of movement of said substrate support; and
ducting thermally stabilizing media in said substrate support away from the target portion in an averaged direction of flow opposite to said averaged progression direction of movement of said substrate support during movement of the substrate along the entire trajectory.

11. A method of manufacturing a device using a lithographic apparatus, the method comprising:
projecting a patterned radiation beam onto a target portion of a substrate that is supported by a substrate support that is in thermal contact with the substrate;
moving the substrate along a predetermined trajectory from a starting target portion to a finish target portion, said trajectory defining an averaged progression direction of movement of said substrate support between said starting target portion and said finish target portion; and
ducting thermally stabilizing media in said support away from said target portion via previously targeted portions of the substrate in an averaged direction of flow opposite to said averaged progression direction of movement, so as to keep subsequently targeted portions thermally stable during movement of the substrate along the entire trajectory.

12. An immersion lithographic apparatus comprising:
an illumination system configured to condition a radiation beam;
a patterning device support constructed to support a patterning device, the patterning device being capable of imparting the radiation beam with a pattern in its cross-section to form a patterned radiation beam;
a substrate support constructed to support a substrate; and
a projection system configured to project the patterned radiation beam onto a target portion of the substrate, said projection system being arranged to provide an optical liquid between the substrate and the projection system for providing immersion lithography;
said substrate support being arranged to move the substrate along a predetermined trajectory of subsequently targeted target portions, said trajectory defining an averaged progression direction of movement of said substrate support;
wherein said substrate support comprises a duct configuration for providing thermal stabilization to said substrate, said duct configuration being arranged to duct thermally stabilizing media in said support, and to substantially duct the media away from a part of said substrate support that supports said target portion in an averaged direction opposite to said averaged progression direction via parts of said substrate support that support previously targeted portions of the substrate, so as to keep subsequently targeted target portions thermally stable during movement of the substrate along the entire trajectory.

* * * * *